United States Patent [19]
Hakamata et al.

[11] Patent Number: 5,736,807
[45] Date of Patent: Apr. 7, 1998

[54] PIEZOELECTRIC TRANSFORMER SUITABLE FOR GENERATING A HIGH VOLTAGE

[75] Inventors: Hiroyo Hakamata; Takeshi Inoue, both of Tokyo, Japan

[73] Assignee: NEC Corporation, Tokyo, Japan

[21] Appl. No.: 742,700

[22] Filed: Nov. 4, 1996

Related U.S. Application Data

[63] Continuation of Ser. No. 504,671, Jul. 20, 1995, abandoned.

[30] Foreign Application Priority Data

Jul. 22, 1994 [JP] Japan .................................. 6-170607

[51] Int. Cl.[6] .............................................. H01L 41/08
[52] U.S. Cl. ................................... 310/359; 310/366
[58] Field of Search ............................ 310/328, 359, 310/366

[56] References Cited

U.S. PATENT DOCUMENTS

| | | | |
|---|---|---|---|
| 5,278,471 | 1/1994 | Uehara et al. | 310/328 |
| 5,440,195 | 8/1995 | Ohnishi et al. | 310/359 |

FOREIGN PATENT DOCUMENTS

A0555887  8/1993  European Pat. Off. ........ H01L 41/08

*Primary Examiner*—Thomas M. Dougherty
*Attorney, Agent, or Firm*—Sughrue, Mion, Zinn, Macpeak & Seas, PLLC

[57] ABSTRACT

In a piezoelectric transformer comprising first and second driving blocks which are operable in a piezoelectric transverse vibration mode to induce a longitudinal vibration in a longitudinal direction and a voltage generating block formed between the first and the second driving blocks and which is operable in a piezoelectric longitudinal vibration mode in response to the longitudinal vibration, the voltage generating block comprises first and second voltage generating portions for generating an output voltage by the piezoelectric longitudinal vibration mode, a primary voltage producing portion formed between the first and the second voltage generating portions, and first and second secondary voltage producing portions formed at both sides of the voltage generating block. The first and the second driving blocks are supplied, in common, with an a.c. voltage through first and second input terminals. The primary and the first and the second secondary voltage producing portions deliver the output voltage through first and second output terminals.

5 Claims, 11 Drawing Sheets

PIEZOELECTRIC TRANSFORMER SUITABLE FOR GENERATING A HIGH VOLTAGE

This is a Continuation of application Ser. No. 08/504,671 filed Jul. 20, 1995 now abandoned.

BACKGROUND OF THE INVENTION

This invention relates to a piezoelectric transformer capable of generating a high voltage with a small size. Such a piezoelectric transformer is particularly useful in a high voltage generating circuit for a deflection device of a television unit and an electrification device of a copy machine.

Such a piezoelectric transformer is manufactured by the use of a piezoelectric plate member. Namely, first and second driving blocks are formed at both sides of the piezoelectric plate member. Each of the first and the second driving blocks is supplied with an a.c. input voltage through first and second input terminals. Each of the first and the second driving blocks induces a longitudinal vibration by a piezoelectric transverse effect in a longitudinal direction of the piezoelectric plate member. A voltage generating block is formed at a middle portion between the first and the second driving blocks. The voltage generating block generates an a.c. output voltage by a piezoelectric longitudinal effect induced by the first and the second driving blocks.

Each of the first and the second driving blocks comprises a plurality of thin piezoelectric layers which are stacked through a plurality of internal electrodes and which are alternatively polarized in a thickness direction of the piezoelectric plate member. The plurality of internal electrodes are numbered from one to n, where n represents a positive integer, and divided into odd and even number groups. First and second outer electrodes are formed on first and second side surfaces of the the piezoelectric plate member. The first outer electrode is for connecting, in common, the odd number group of the plurality of internal electrodes to the first input terminal. The second outer electrode is for connecting, in common, the even number group of the plurality of internal electrodes to the second input terminal.

The voltage generating block comprises first and second voltage generating portions formed apart from each other. The first and the second voltage generating portions are polarized in opposite directions in the longitudinal direction and generate an output voltage by the longitudinal vibration. A voltage producing portion is formed at a middle portion between the first and the second voltage generating portions through a plurality of internal strip electrodes. An outer strip electrode is formed around the piezoelectric plate member, namely, upper and under surfaces and the first and the second side surfaces. The outer strip electrode is for connecting, in common, the plurality of internal strip electrodes to an output terminal at both sides thereof.

In order to produce the output voltage, two output terminals are required. The piezoelectric transformer mentioned above is, however, provided with a single output terminal as one of the two output terminals. One of the first and the second input terminals is used for other one of the two output terminals.

In the piezoelectric transformer for generating a high voltage, it is desirable to have a pair of input terminals and a pair of output terminals all of which are electrically insulated from each other, taking the safety of a device including the piezoelectric transformer and freedom in the circuit design into consideration. Nevertheless, it is hard to realize the above requirement in the conventional piezoelectric transformer.

SUMMARY OF THE INVENTION

It is therefore an object of this invention to provide a piezoelectric transformer with a pair of input terminals and a pair of output terminals.

It is another object of this invention to provide a piezoelectric transformer of minimal size which is suitable for generating a high voltage and which has a large step-up ratio.

Other objects of this invention will become clear as the description proceeds.

On describing the gist of this invention, it is possible to understand that a piezoelectric transformer comprises a piezoelectric plate member, first and second driving blocks which are formed at both sides of the piezoelectric plate member and which are operable in a piezoelectric transverse vibration mode to induce a longitudinal vibration in a longitudinal direction by an a.c. voltage, and a voltage generating block formed between the first and the second driving blocks and which is operable in a piezoelectric longitudinal vibration mode in response to the longitudinal vibration induced by the first and the second driving blocks.

According to an aspect of this invention, each of the first and the second driving blocks comprises a plurality of thin piezoelectric layers which are stacked through a plurality of internal electrodes and which are alternatively polarized in a thickness direction of the piezoelectric plate member. The voltage generating block comprises first and second voltage generating portions formed apart from each other to generate an output voltage by the piezoelectric longitudinal vibration mode, a primary voltage producing portion formed between the first and the second voltage generating portions and comprising a plurality of thin piezoelectric layers which are stacked through a plurality of primary internal electrodes, and first and second secondary voltage producing portions which are formed at both sides of the voltage generating block. Each of the first and the second secondary voltage generating portions comprises a plurality of thin piezoelectric layers which are stacked through a plurality of secondary internal electrodes. The first and the second voltage generating portions are polarized in opposite directions in the longitudinal direction. The first and the second driving blocks are supplied, in common, with the a.c. voltage through first and second input terminals. The primary and the first and the second secondary voltage producing portions deliver the output voltage through first and second output terminals.

DESCRIPTION OF THE PREFERRED EMBODIMENT

Figure 1:
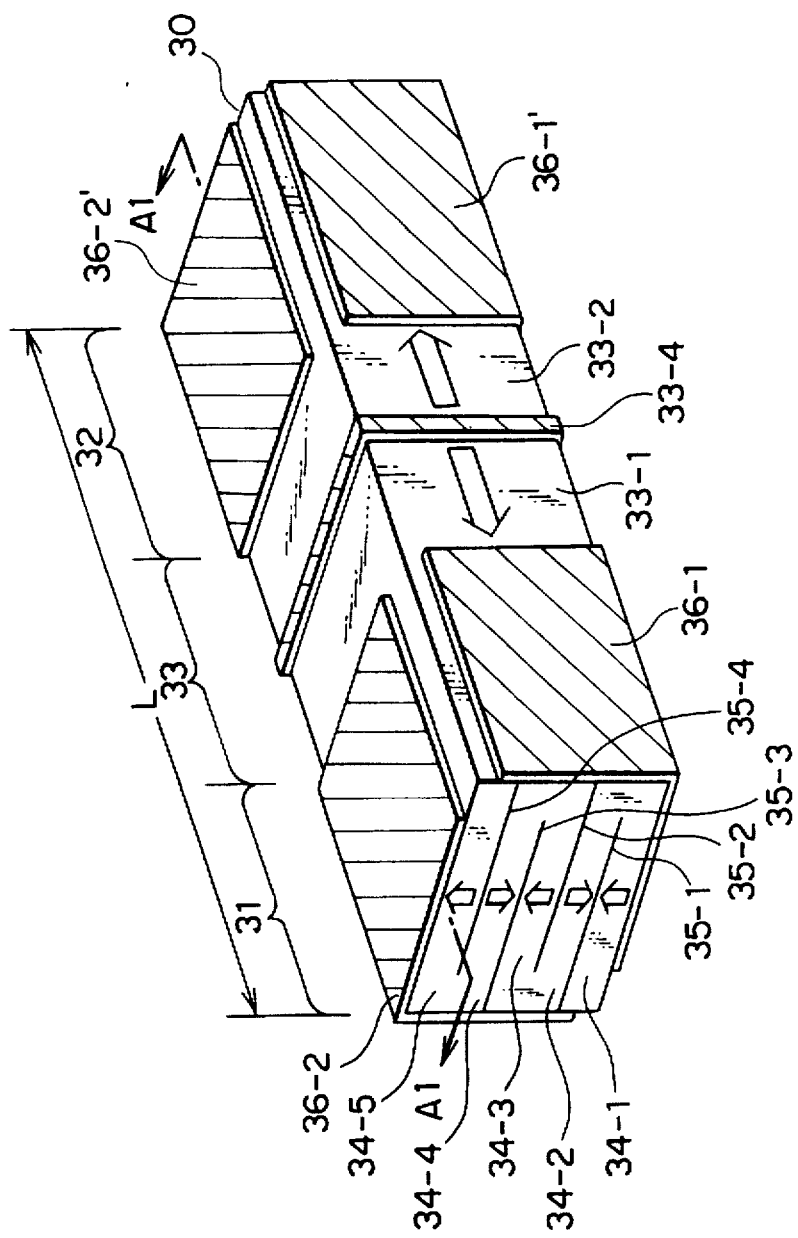
FIG. 1 is a perspective view of a conventional piezoelectric transformer.
Figure 2:
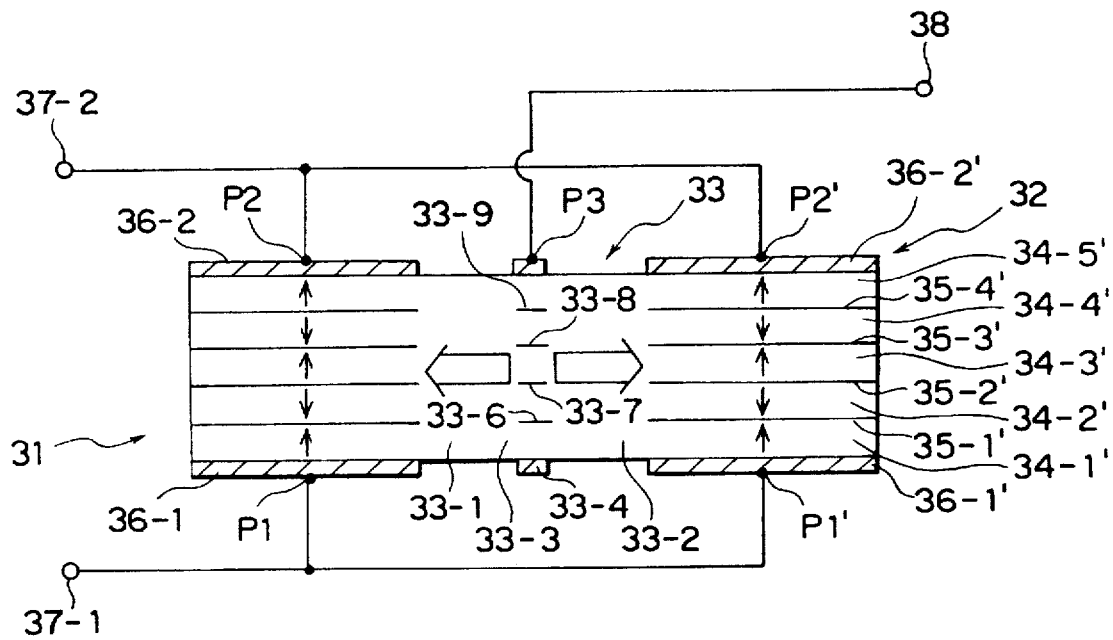
FIG. 2 is a sectional view taken along line A1—A1 in FIG. 1.

Referring to FIGS. 1 and 2, a conventional piezoelectric transformer will be described in order to facilitate an understanding of this invention. In FIG. 1, the piezoelectric transformer is called a stacked Lozen type and comprises a piezoelectric plate member 30 of a stacked structure, first and second driving blocks 31 and 32, and a voltage generating block 33. The first and the second driving blocks 31 and 32 are formed at both sides of the piezoelectric plate member 30 having a predetermined length L.

With reference to the first driving block 31, it comprises first through fifth thin piezoelectric layers 34-1 to 34-5 which are stacked through first through fourth internal electrodes 35-1 to 35-4. As illustrated by arrows, the first through the fifth thin piezoelectric layers 34-1 to 34-5 are alternatively polarized in a thickness direction of the piezoelectric plate member 30. Each of the first through the fifth thin piezoelectric layers 34-1 to 34-5 may be called an active piezoelectric layer. For example, the first thin piezoelectric layer 34-1 is polarized upward of FIG. 1 while a second thin piezoelectric layer 34-2 is polarized downward of FIG. 1. The first through the fourth internal electrodes 35-1 to 35-4 are divided into odd and even number groups. For example, the first and a third internal electrodes 35-1 and 35-3 belong to the odd number group. A first outer electrode 36-1 is formed on a first side surface and an under surface of the piezoelectric plate member 30. A second outer electrode 36-2 is formed on a second side surface and an upper surface of the piezoelectric plate member 30.

As apparent from FIGS. 1 and 2, the first outer electrode 36-1 is for connecting, in common, the even number group of the internal electrodes, namely, the second and the fourth internal electrodes 35-2 and 35-4, to a first input terminal 37-1. The second outer electrode 36-2 is for connecting, in common, the odd number group of the internal electrodes, namely, the first and third internal electrodes 35-1 and 35-3 to a second input terminal 37-2.

Like the first driving block 31, the second driving block 32 comprises first through fifth thin piezoelectric layers 34-1' to 34-5' which are stacked through first through fourth internal electrodes 35-1' to 35-4'. The first through the fifth thin piezoelectric layers 34-1' to 34-5' are alternatively polarized in a thickness direction of the piezoelectric plate member 30. A first outer electrode 36-1' is formed on the first side surface and the under surface of the piezoelectric plate member 30. A second outer electrode 36-2' is formed on the second side surface and the upper surface of the piezoelectric plate member 30. The first outer electrode 36-1' connects, in common, a second and the fourth internal electrodes 35-2' and 35-4' to the first input terminal 37-1. The second outer electrode 36-2' connects, in common, the first and a third internal electrodes 35-1' and 35-3' to the second input terminal 37-2.

The voltage generating block 33 is formed at a middle portion between the first and the second driving blocks 31 and 32. The voltage generating block 33 has high impedance and comprises first and second voltage generating portions 33-1 and 33-2 formed apart from each other. The first and the second voltage generating portions 33-1 and 33-2 have no internal electrodes and are polarized in opposite directions in the longitudinal direction as illustrated by arrows. A voltage producing portion 33-3 is formed between the first and the second voltage generating portions 33-1 and 33-2 through first through fourth internal strip electrodes 33-6 to 33-9. An outer strip electrode 33-4 is formed around the piezoelectric plate member 30, namely, the first and the second side surfaces and the upper and the under surfaces. The outer strip electrode 33-4 is for connecting, in common, both sides of the first through the fourth internal electrodes 33-6 to 33-9 to an output terminal 38.

Each of the first and the second driving blocks 31 and 32 is supplied with an a.c. voltage through the first and the second input terminals 37-1 and 37-2. It is supposed that the piezoelectric transformer mentioned above has a resonance frequency Fr. As well known in the art, if the piezoelectric transformer is supplied with the a.c. voltage having the resonance frequency Fr, a high voltage can be generated by the piezoelectric transformer. Namely, the piezoelectric transformer serves as a step-up transformer. In the first driving block 31, each of the first through the fifth thin piezoelectric layers 34-1 to 34-5 are energized by the same phase because the first through the fifth thin piezoelectric layers 34-1 to 34-5 are alternatively polarized. This applies to the second driving block 32. Each of the first and the second driving blocks 31 and 32 operates by a piezoelectric transverse effect which is called a piezoelectric transverse effect 31 mode and induces longitudinal vibration in the longitudinal direction of the piezoelectric plate member 30. As a result, the voltage generating block 33 operates by a piezoelectric longitudinal effect which is called a piezoelectric longitudinal effect 33 mode. In the first voltage generating portion 33-1, a boosted or step-up a.c. voltage is generated between the outer strip electrode 33-4 and the first outer electrode 36-1 and between the outer strip electrode 33-4 and the second outer electrode 36-2. Similarly, in the second voltage generating portion 33-2, a boosted a.c. voltage is generated between the outer strip electrode 33-4 and the first outer electrode 36-1' and between the outer strip electrode 33-4 and the second outer electrode 36-2'. These boosted a.c. voltages are outputted through the output terminal 38.

If the a.c. voltage is supplied through the output terminal 38, a step-down voltage can be obtained through the input terminals 37-1 and 37-2. Namely, the piezoelectric transformer serves as a step-down transformer.

Figure 3:
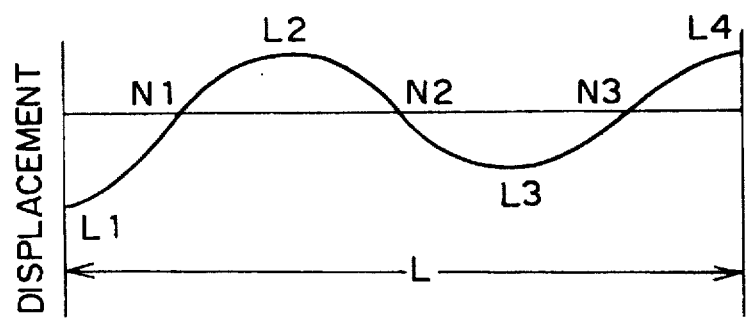
FIG. 3 shows a displacement distribution of the piezoelectric transformer illustrated in FIG. 1.

Referring afresh to FIG. 3 together with FIG. 2, a description will be made of the relation between the first input terminal 37-1 and the first outer electrodes 36-1 and 36-1', the second input terminal 37-2 and the second outer electrodes 36-2 and 36-2', and between the output terminal 38 and the outer strip electrode 33-4. The first input terminal 37-1 is connected to the first outer electrodes 36-1 and 36-1' at connection points P1 and P1', respectively. The second input terminal 37-2 is connected to the second outer electrodes 36-2 and 36-2' at connection points P2 and P2', respectively. The output terminal 38 is connected to the outer strip electrode 33-4 at a connection point P3.

FIG. 3 shows a displacement distribution of the piezoelectric transformer in the longitudinal direction in a longitudinal vibration tertiary mode. In such a mode, three halves of the wave length of the longitudinal vibration is equal to the predetermined length L of the piezoelectric transformer. In this case, the displacement distribution is defined by first through third nodes N1 to N3 and first through fourth antinodes L1 to L4. It is possible to make the connection points P1 and P2 coincide with the first node N1 while the connection points P1' and P2' coincide with the third node N3. It is further possible to make the connection point P3 coincide with a second node N2. This means that it is possible to obtain a favorable vibration characteristic and reliability of connection between the first input terminal 37-1 and the first outer electrodes 36-1 and 36-1', the second input terminal 37-2 and the second outer electrodes 36-2 and 36-2', and between the output terminal 38 and the outer strip electrode 33-4.

It is desirable that the piezoelectric transformer comprises a pair of input terminals and a pair of output terminals all of which are electrically insulated from each other, taking safety of a device including the piezoelectric transformer and the degree of freedom in the circuit design into consideration. This is important when the piezoelectric transformer is used for generating high voltage. Nevertheless, it is hard to realize the above requirement in the conventional piezoelectric transformer. Namely, the piezoelectric transformer discussed above is provided only with the output terminal 38 as one of two output terminals. One of the first and the second input terminals 37-1 and 37-2 is used as the other one of the two output terminals.

Figure 4:
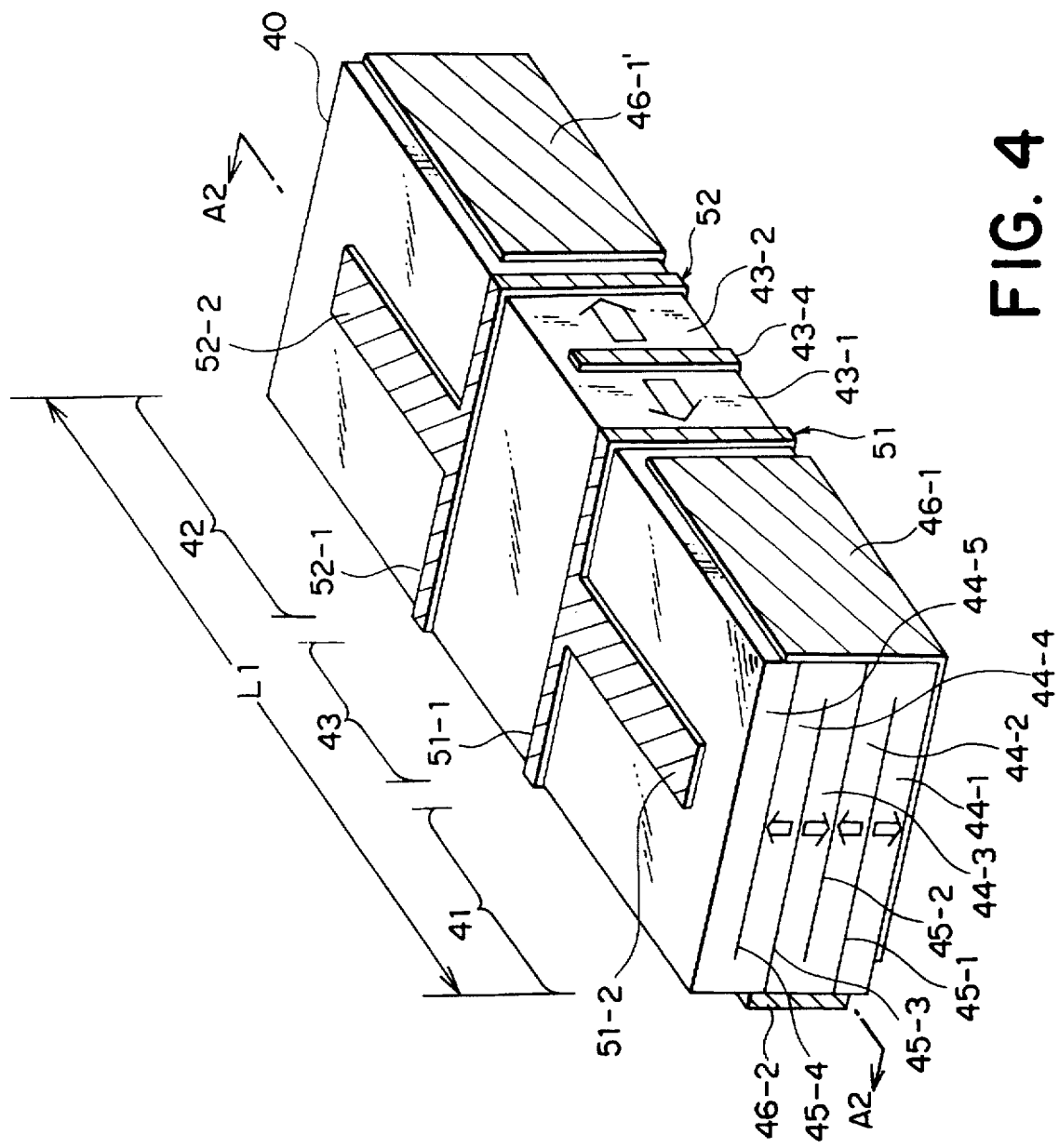
FIG. 4 is a perspective view of a piezoelectric transformer according to a first embodiment of this invention.
Figure 5:
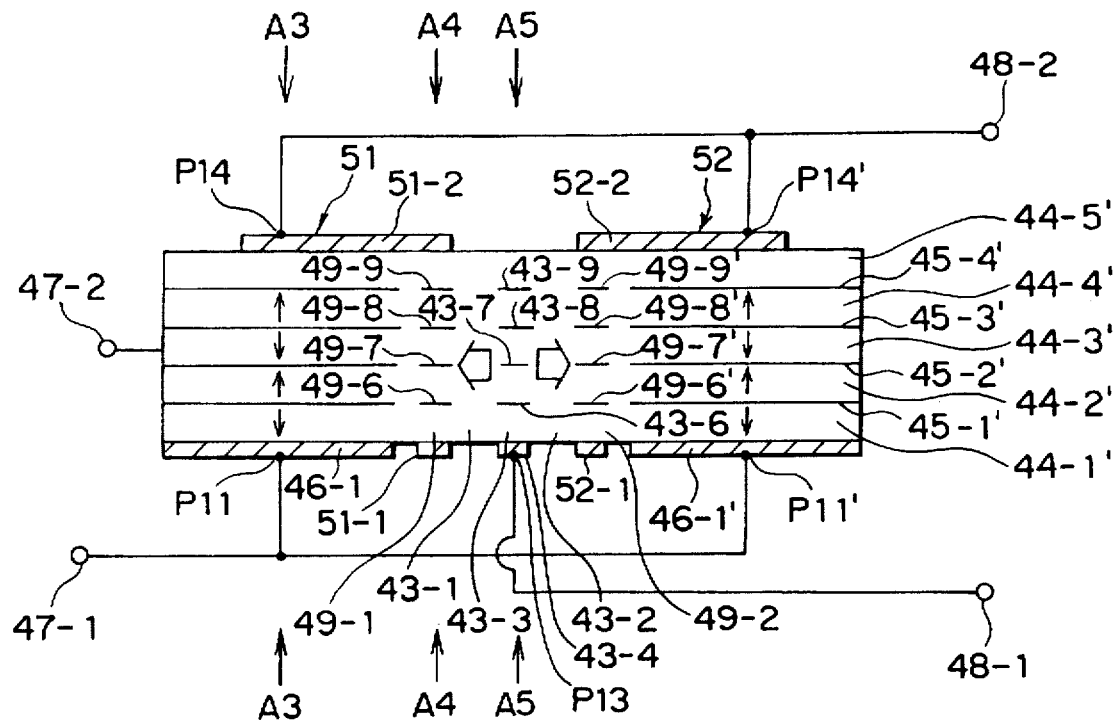
FIG. 5 is a sectional view taken along line A2—A2 in FIG. 4.

Referring to FIGS. 4 and 5, the description will proceed to a piezoelectric transformer according to a first embodiment of this invention. In FIG. 5, the piezoelectric transformer is called a stacked Lozen type and comprises a piezoelectric plate member 40 of a stacked structure, first and second driving blocks 41 and 42, and a voltage generating block 43. The first and the second driving blocks 41 and 42 are formed at both sides of the piezoelectric plate member 40 having a preselected length L1.

The description will be made of the first driving block 41. The first driving block 41 comprises first through fifth thin piezoelectric layers 44-1 to 44-5 which are stacked through first through fourth internal electrodes 45-1 to 45-4. It should be noted here that the first through the fourth thin piezoelectric layers 44-1 to 44-4 are alternatively polarized in a thickness direction of the piezoelectric plate member 40 as illustrated by arrows. For example, the first thin piezoelectric layer 44-1 is polarized upward of FIG. 4 while a second thin piezoelectric layer 44-2 is polarized downward of FIG. 4. Each of the first through the fourth thin piezoelectric layers 44-1 to 44-4 may be called an active piezoelectric layer while the fifth thin piezoelectric layer 44-5 may be called an inactive piezoelectric layer. The first through the fourth internal electrodes 45-1 to 45-4 are divided into odd and even number groups. For example, the first and a third internal electrodes 45-1 and 45-3 belong to the odd number group. A first outer electrode 46-1 is formed on a first side surface and an under surface of the piezoelectric plate member 40. A second outer electrode 46-2 is formed on a second side surface of the piezoelectric plate member 40.

As apparent from FIGS. 4 and 5, the first outer electrode 46-1 is for connecting, in common, the even number group of the internal electrodes, namely, a second and the fourth internal electrodes 45-2 and 45-4, to a first input terminal 47-1. The second outer electrode 46-2 is for connecting, in common, the odd number group of the internal electrodes, namely, the first and the third internal electrodes 45-1 and 45-3 to a second input terminal 47-2.

Like the first driving block 41, the second driving block 42 comprises first through fifth thin piezoelectric layers 44-1' to 44-5' which are stacked through first through fourth internal electrodes 45-1' to 45-4'. As depicted by arrows, the first through fourth thin piezoelectric layers 44-1' to 44-4' are alternatively polarized in a thickness direction of the piezoelectric plate member 40. The first through the fourth thin piezoelectric layers 44-1' to 44-4' serve as the active piezoelectric layer while the fifth thin piezoelectric layer 44-5' serves as the inactive piezoelectric layer. A first outer electrode 46-1' is formed on the first side surface and the under surface of the piezoelectric plate member 40. Like the second outer electrode 46-2, a second outer electrode 46-2' (FIG. 11) for the second driving block 42 is formed on the second side surface of the piezoelectric plate member 40. The first outer electrode 46-1' connects, in common, second and fourth internal electrodes 45-2' and 45-4' to the first input terminal 47-1. The second outer electrode 46-2' connects, in common, the first and the third internal electrodes 45-1' and 45-3' to the second input terminal 47-2.

The illustrated structure is a piezoelectric transformer comprising an even number of active piezoelectric layers, namely, four, in number. If the piezoelectric transformer comprises an odd number of active piezoelectric layers, the first outer electrode 46-1 is formed on the first side surface of the piezoelectric plate member 40 while the second outer electrode 46-2 is formed on the second side surface and the under surface of the piezoelectric plate member 40.

The voltage generating block 43 is formed at a middle portion between the first and the second driving blocks 41 and 42. The voltage generating block 43 comprises first and second voltage generating portions 43-1 and 43-2 formed apart from each other. The first and the second voltage generating portions 43-1 and 43-2 have no internal electrodes and are polarized in opposite directions in the longitudinal direction of the piezoelectric plate member 40 as depicted by arrows. A primary voltage producing portion 43-3 is formed between the first and the second voltage generating portions 43-1 and 43-2 and comprises first through fifth thin piezoelectric layers which are stacked through first through fourth primary internal strip electrodes 43-6 to 43-9. A primary outer strip electrode 43-4 is formed on the first and the second side surfaces and the under surface of the piezoelectric plate member 40 so as to surround the first through the fourth primary internal strip electrodes 43-6 to 43-9 on the first and the second side surfaces and the under surface. The primary outer strip electrode 43-4 is for connecting, in common, both sides of the first through the fourth primary internal electrodes 43-6 to 43-9 to a first output terminal 48-1. The primary voltage producing portion 43-3 may be called a middle electrode portion.

The voltage generating block 43 further comprises first and second secondary voltage producing portions 49-1 and 49-2. The first voltage producing portion 49-1 is formed between the first driving block 41 and the first voltage generating portion 43-1 and comprises first through fifth thin piezoelectric layers which are stacked through first through fourth secondary internal strip electrodes 49-6 to 49-9. The second secondary voltage producing portion 49-2 is formed between the second driving block 42 and the second voltage generating portion 43-2 comprises first through fifth thin piezoelectric layers which are stacked through first through fourth secondary internal strip electrodes 49-6' to 49-9'. First and second secondary outer electrodes 51 and 52 are formed around the piezoelectric plate member 40, namely, on the first and the second side surfaces and the upper and the under surfaces of the piezoelectric plate member 40. The first secondary outer electrode 51 comprises a strip electrode portion 51-1 formed around the first secondary voltage producing portion 43-1 and a plate electrode portion 51-2 formed on an upper surface of the fifth thin piezoelectric layer 44-5. In other words, the strip electrode portion 51-1 surrounds the first through the fourth secondary internal strip electrodes 49-6 to 49-9 on the first and the second side surfaces and the upper and the under surfaces. The first secondary outer electrode 51 is for connecting, in common, both sides of the first through the fourth secondary internal strip electrodes 49-6 to 49-9 to a second output terminal 48-2. Similarly, the second secondary outer electrode 52 comprises a strip electrode portion 52-1 formed around the second secondary voltage producing portion 43-2 and a plate electrode portion 52-2 formed on the upper surface of the fifth thin piezoelectric layer 44-5. The second secondary outer electrode 52 is for connecting, in common, both sides of the first through the fourth secondary internal strip electrodes 49-6' to 49-9' to the second output terminal 48-2. Each of the first and the second secondary voltage producing portions 49-1 and 49-2 may be called an earth electrode portion.

As apparent from FIGS. 4 and 5, the first and the second outer electrodes 46-1, 46-1', 46-2, 46-2', the primary outer electrode 43-4, and the first and the second secondary outer electrodes 51 and 52 are electrically insulated from each other.

Each of the first and the second driving blocks 41 and 42 is supplied with an a.c. voltage through the first and the second input terminals 47-1 and 47-2. It is supposed that the piezoelectric transformer mentioned above has a resonance frequency Fc. As mentioned before, if the piezoelectric transformer is supplied with the a.c. voltage having the resonance frequency Fc, a high voltage can be generated by the piezoelectric transformer. Namely, the piezoelectric transformer serves as a step-up transformer. In the first driving block 41, each of the first through the fourth thin piezoelectric layers 44-1 to 44-4 are energized by the same phase because the first through the fourth thin piezoelectric layers 44-1 to 44-4 are alternatively polarized. This also applies to the second driving block 42. Each of the first and the second driving blocks 41 and 42 operates by a piezoelectric transverse effect 31 mode via an electromechanical coupling factor $k_{31}$ and induces longitudinal vibration in the longitudinal direction of the piezoelectric plate member 40. As a result, the voltage generating block 43 operates by a piezoelectric longitudinal effect 33 mode via an electromechanical coupling factor $k_{33}$. In the first voltage generating portion 43-1, a boosted or step-up a.c. voltage is generated between the primary outer strip electrode 43-4 and the first secondary outer electrode 51.

Similarly, in the second voltage generating portion 43-2, a boosted a.c. voltage is generated between the primary outer strip electrode 43-4 and the second secondary outer electrode 52. These boosted a.c. voltages are outputted through the first and the second output terminals 48-1 and 48-2. If the a.c. voltage is supplied through the first and the second output terminals 48-1 and 48-2, a step-down voltage can be obtained through the first and the second input terminals 47-1 and 47-2. Thus, the piezoelectric transformer serves as a step-down transformer.

Figure 6:
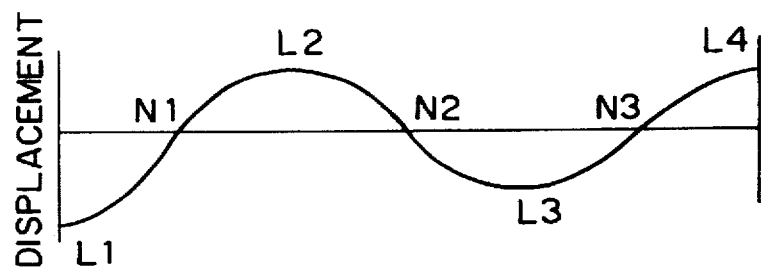
FIG. 6 shows a displacement distribution of the piezoelectric transformer illustrated in FIG. 4.
Figure 7:
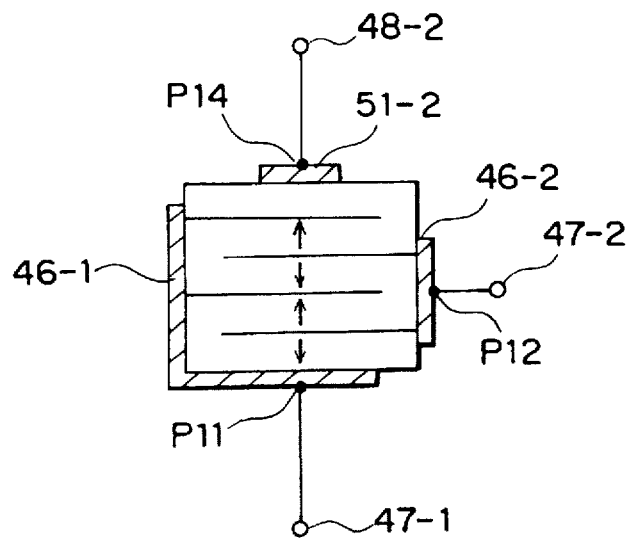
FIG. 7 is a sectional view taken along line A3—A3 in FIG. 5.
Figure 8:
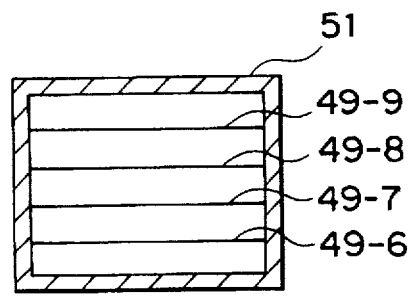
FIG. 8 is a sectional view taken along line A4—A4 in FIG. 5.
Figure 9:
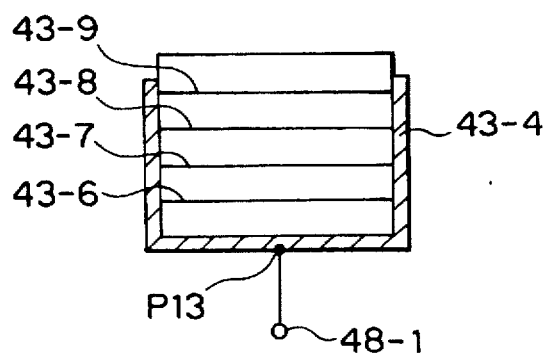
FIG. 9 is a sectional view taken along line A5—A5 in FIG. 5.

Referring to FIGS. 6 to 9 together with FIG. 5, the relation of the first and the second input terminals 47-1 and 47-2 and the first and the second output terminals 48-1 and 48-2 will be described. The first input terminal 47-1 is connected to the first outer electrodes 46-1 and 46-1' at connection points P11 and P11', respectively, as shown in FIGS. 5 and 7. Each of the connection points P11 and P11' is defined by a quarter of a wavelength of the longitudinal vibration tertiary mode. Namely, each of the connection points P11 and P11' is apart from an end portion of the piezoelectric plate member 40 by a distance which is equal to a quarter of the wavelength of the longitudinal vibration tertiary mode. As illustrated in FIG. 7, the second input terminal 47-2 is connected to the second outer electrode 46-2 at a connection point P12. Like the connection points P11 and P11', the connection point P12 is apart from the end portion of the piezoelectric plate member 40 by the distance which is equal to a quarter of the wavelength of the longitudinal vibration tertiary mode. This applies to the second outer electrode 46-2' for the second driving block 42.

The first output terminal 48-1 is connected to the primary outer strip electrode 43-4 at a connection point P13. The connection point P13 is defined by a center of the piezoelectric plate member 40. The second output terminal 48-2 is connected to the first and the second secondary outer electrodes 51 and 52 at connection points P14 and P14', respectively, as shown in FIG. 5. Each of the connection points P14 and P14' is also defined by a quarter of the wavelength of the longitudinal vibration tertiary mode. Namely, each of the connection points P14 and P14' is also apart from the end portion of the piezoelectric plate member 40 by the distance which is equal to a quarter of the wavelength of the longitudinal vibration tertiary mode. This is because the first and the second secondary outer electrodes 51 and 52 comprises the plate electrode portions 51-2 and 52-2 which extend towards the end portions of the piezoelectric plate member 40. For this purpose, the fifth thin piezoelectric layer 44-5, (the inactive piezoelectric layer) is formed on the fourth thin piezoelectric layer 44-4 (the active piezoelectric layer). This is the reason why the fifth thin piezoelectric layer 44-5 is an inactive piezoelectric layer.

FIG. 6 shows a displacement distribution of the piezoelectric transformer in the longitudinal direction in a longitudinal vibration tertiary mode. In such a mode, three halves of the wave length of the longitudinal vibration is equal to the preselected length L1 of the piezoelectric transformer. In this case, the displacement distribution is defined by first through third nodes N1 to N3 and first through fourth antinodes L1 to L4. Particularly, the first and the third nodes N1 and N3 are apart from the end portion of the piezoelectric plate member 40 by the distance which is equal to a quarter of the wavelength of the longitudinal vibration tertiary mode. The second node N2 is present at a center of the piezoelectric transformer. This means that it is possible to make the connection points P11 and P14 coincide with the first node N1 while the connection points P11' and P14' coincide with the third node N3. It is further possible to make the connection point P13 coincide with a second node N2. As a result, it is possible to obtain a favorable vibration characteristic and reliability of connection at the connection points P11, P11', P12, P13, P14, and P14'.

On manufacturing of the piezoelectric transformer, electric flux lines for polarizing the first and the second voltage generating portions 43-1 and 43-2 are parallel with the longitudinal direction of the piezoelectric plate member 40. This is because the voltage generating block 43 comprises the first through the fourth secondary internal electrodes 49-6 to 49-9 and 49-6' to 49-9' which adjoin the first and the second voltage generating portions 43-1 and 43-2. Accordingly, a polarization direction in the first and the second voltage generating portions 43-1 and 43-2 becomes parallel with the longitudinal direction of the piezoelectric plate member 40. As a result, the electromechanical coupling factor $k_{33}$ greatly increases.

Figure 10:
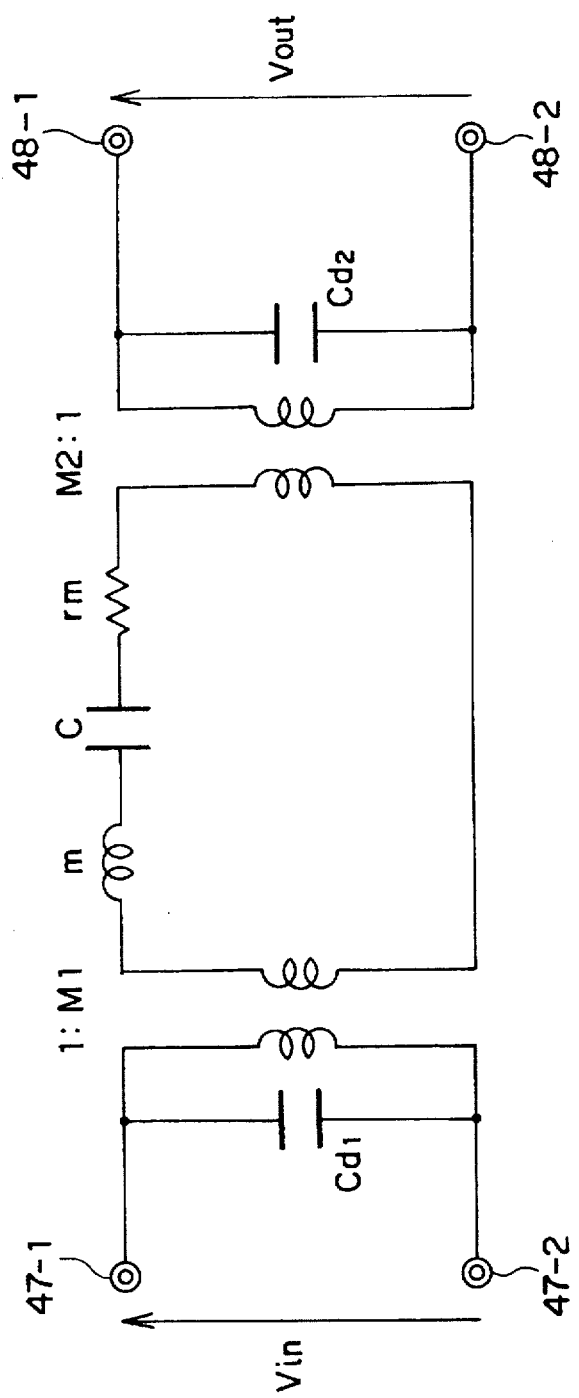
FIG. 10 shows a lumped constant equivalent circuit defined by a resonance frequency of the piezoelectric transformer illustrated in FIG. 4.

Referring to FIG. 10, a lumped constant equivalent circuit of the resonance frequency Fc defined by the piezoelectric transformer illustrated in FIG. 4 will be described. The lumped constant equivalent circuit comprises input and output damper capacitors Cd1 and Cd2, an equivalent mass m, an equivalent compliance c, and an equivalent mechanical resistor $r_m$ which are related to the longitudinal vibration tertiary mode. M1 and M2 represent input and output force factors, respectively. The input and the output force factors M1 and M2 are represented by the following equations given by;

$$M1 = w \cdot (\epsilon^T_{33}/s^E_{11}) \cdot k_{31} n, \quad (1)$$

$$M2 = w \cdot t/L2(\epsilon^T_{33}/s^E_{33})^{1/2} k_{33}, \quad (2)$$

where w and t represent a width and a thickness of the piezoelectric transformer, respectively. $L_2$ represents a half length of an output portion, $\epsilon$ and s represent permittivity and an elastic compliance, respectively.

In general, an output voltage Vout of the piezoelectric transformer varies with the value of a load resistor connected to the first and the second output terminals 48-1 and 48-2 and becomes high as the value of the load resistor becomes large. However, the value of the load resistor is relatively small in a use for a high voltage and a high electric power. This means that the output voltage Vout becomes low. In the piezoelectric transformer according to the embodiment, the input force factor M1 becomes large in proportion to the number of the thin piezoelectric layers because each of the first and the second driving blocks 41 and 42 comprises a plurality of thin piezoelectric layers. This means that it is possible to generate the high output voltage even when the value of the load resistor is relatively small.

Let the electric power of the piezoelectric transformer according to the embodiment compare with that of the piezoelectric transformer defined by the piezoelectric transverse effect secondary mode having the electromechanical coupling factor $k_{31}$. In this case, a ratio of the electric power is given by;

$$\{k_{33}^2/1-k_{33}^2)\}/\{k_{31}^2/(1-k_{31}^2)\}.$$

If the electromechanical coupling factors $k_{33}$ and $k_{31}$ are given by 0.6 and 0.35, respectively, the piezoelectric transformer according to the embodiment can generate four times as much electric power as the piezoelectric transformer of the piezoelectric transverse effect. In other words, the size of the piezoelectric transformer according to the embodiment becomes a quarter of that of the piezoelectric transformer of the piezoelectric transverse effect.

The description will proceed to a method of manufacturing the piezoelectric transformer. As material for the piezoelectric plate member 40, PZT (Pb—ZrO$_3$—PbTiO$_3$) system piezoelectric material is used. The internal electrodes of the first and the second driving blocks 41 and 42 and the primary and the secondary strip electrodes in the voltage generating block 43 are formed in the following manner. As material for the internal electrodes, Pt paste is printed on a green sheet of the piezoelectric material by a screen print method. Such a process is repeated until the number of the thin piezoelectric layers reaches the required number. Such a manner is well known in the art as a green sheet method. Then, stacked green sheets are burned. The piezoelectric material and the material for the internal electrodes may be implemented by other materials. Moreover, the green sheet method may be replaced by other manners.

In practice, the number of the green sheets is equal to eleven while the number of the internal electrodes is equal to ten. Each of the green sheets has a thickness of, for example, 0.2 mm. In this case, a thickness of the stacked green sheets is equal to 2.2 mm. After burning, the stacked green sheets are cut into a plurality of piezoelectric plate members each of which has a length of, for example, 36.86 mm and a width of, for example, 5.3 mm. In order to form the outer electrodes, Ag paste is coated on the piezoelectric plate member. Next, such a piezoelectric plate member is burned. In addition, the outer electrodes may be formed by the use of the other material different from Ag and by other manners, such as a vapor deposition method and a sputter deposition method. After this, the heating temperature is raised to a Curie temperature of the piezoelectric material. A polarization process is carried out during cooling process. An electric field of, for example, 3 kV/mm is impressed in the longitudinal direction of the piezoelectric plate member during the cooling process. With regard to the polarization in the thickness direction, it is carried out in insulating oil of 150 degrees Celsius by impressing the electric field of, for example, 2 kV/mm. As a result, it is possible to obtain a structure such that only the fifth thin piezoelectric layer serves as the inactive piezoelectric layer.

Lead wires for the first and the second input terminals and the first and the second output terminals are then connected at the respective connection points illustrated in FIGS. 5 and 7. For example, the connection points P11, P11', and P12 are spaced 6.14 mm away from the end portions of the piezoelectric plate member 40. The connection points P14 and P14' are also 6.14 mm away from the end portions of the piezoelectric plate member 40. The connection point P13 is at the center of the piezoelectric plate member 40 and is 18.43 mm away from the end portions of the piezoelectric plate member 40. The resonance frequency Fc in the longitudinal vibration tertiary mode is measured 130 kHz from a frequency characteristic of admittance.

Figure 11:
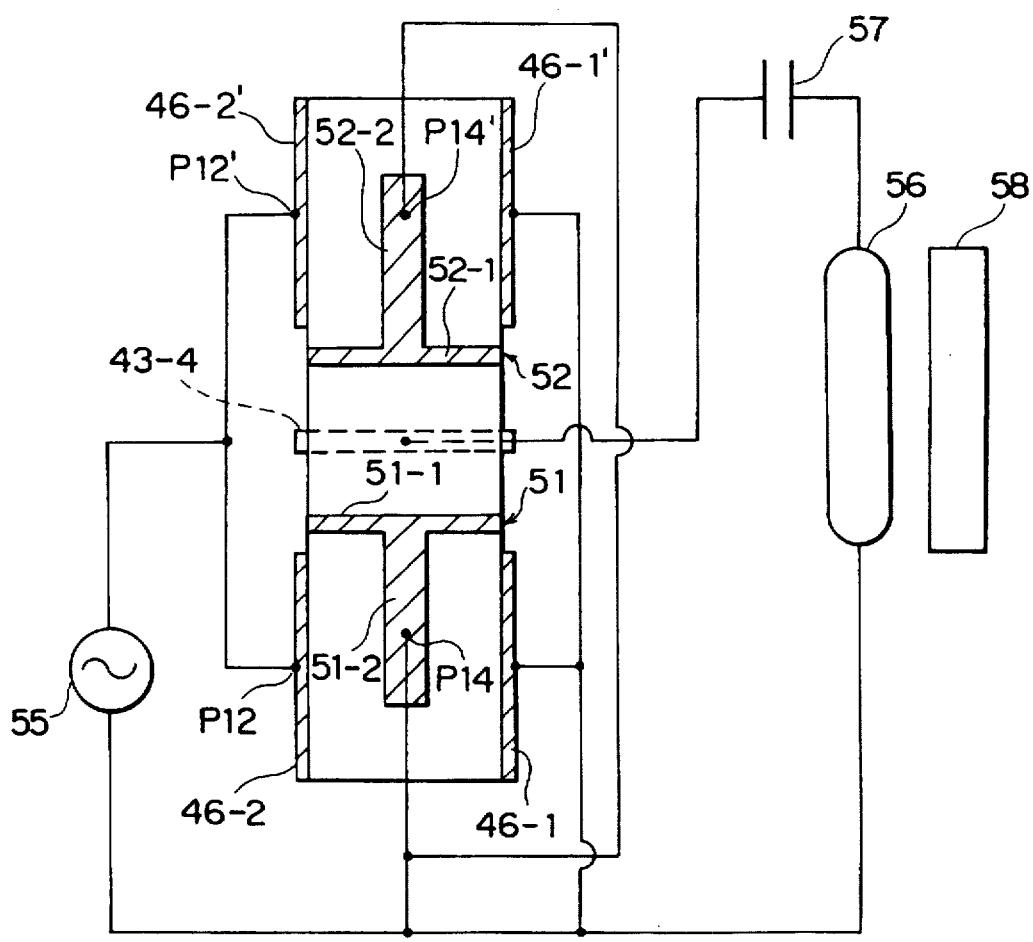
FIG. 11 is a circuit arrangement for describing connection relation among an alternate power supply unit, the piezoelectric transformer illustrated in FIG. 4, and a load.

Referring to FIG. 11, the piezoelectric transformer is supplied with the a.c. voltage from an alternate power supply unit 55. A cold-cathode tube 56 is used as a load to be connected to the piezoelectric transformer. The cold-cathode tube 56 has a length of, for example, 220 mm and a diameter of, for example, 3 mm. A ballast capacitor 57 is connected, in serial, to the cold-cathode tube 56. The ballast capacitor 57 has a capacitance of, for example, 47 pF. A reflector plate 58 made of aluminum material is connected, in parallel, to the cold-cathode tube 56. In the example, when the piezoelectric transformer is supplied with the input voltage of 10 $V_{p-p}$, it is possible to obtain the output voltage of 550 V and the output electric power of 3 W. In durability tests is carried out on 100 piezoelectric transformers, when driven for 200 consecutive hours, not a single piezoelectric transformer had exfoliation of the outer electrode, a cut of the lead wire, or an abnormal characteristic.

Figure 12:
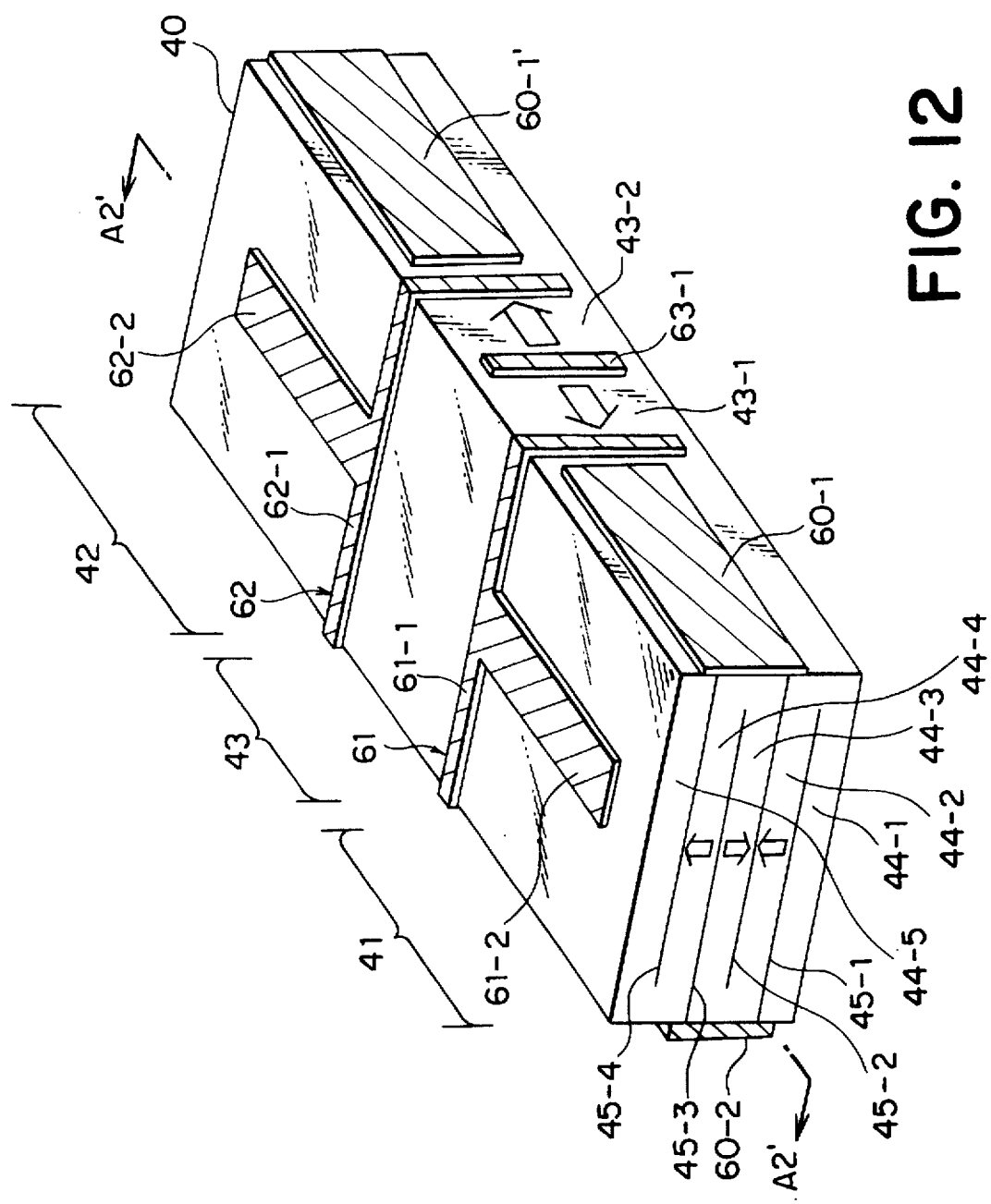
FIG. 12 is a perspective view of a piezoelectric transformer according to a second embodiment of this invention.
Figure 13:
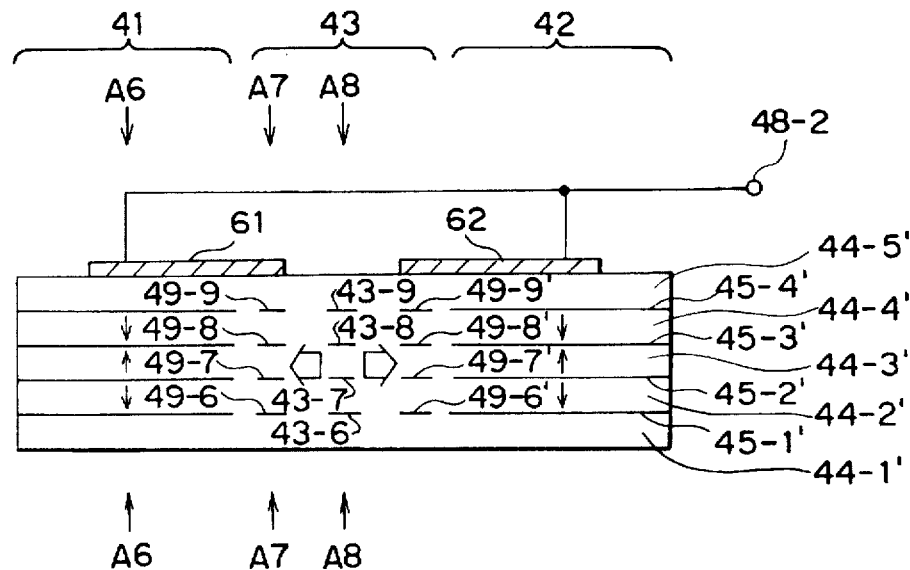
FIG. 13 is a sectional view taken along line A2'—A2' in FIG. 12.
Figure 14:
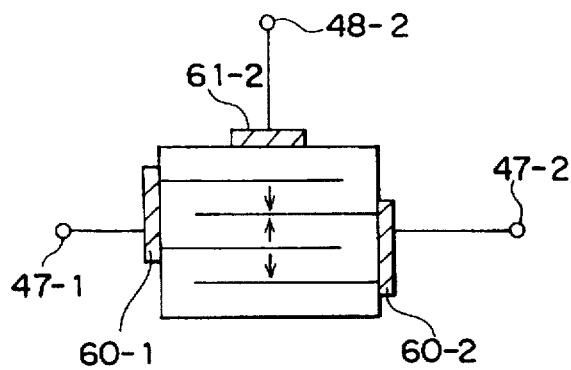
FIG. 14 is a sectional view taken along line A6—A6 in FIG. 12.
Figure 15:
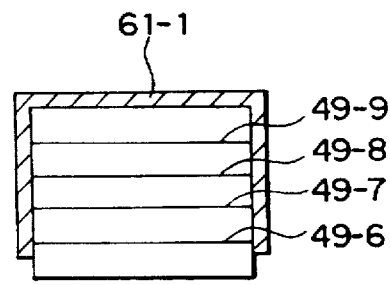
FIG. 15 is a sectional view taken along line A7—A7 in FIG. 12.
Figure 16:
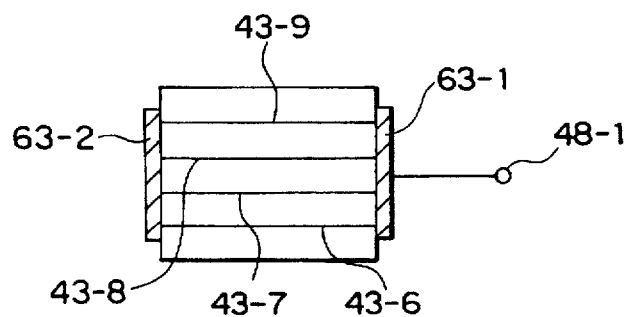
FIG. 16 is a sectional view taken along line A8—A8 in FIG. 12.

Referring to FIGS. 12 to 16, the description will proceed to a piezoelectric transformer according to a second embodiment of this invention. In FIG. 12, the piezoelectric transformer is also called a stacked Lozen type and comprises similar parts designated by like reference numerals except that the first thin piezoelectric layer 44-1 serves as the inactive piezoelectric layer and that the outer electrodes are different from those illustrated in FIG. 4. Namely, the second through the fourth thin piezoelectric layers 44-2 to 44-4 are alternately polarized.

In the first driving block 41, first and second outer electrodes 60-1 and 60-2 are formed on the first and the second side surfaces, respectively, of the piezoelectric plate member 40 in place of the first and the second outer electrodes 46-1 and 46-2. The first outer electrode 60-1 connects, in common, the second and the fourth internal electrodes 45-2 and 45-4 to the first input terminal 47-1. The second outer electrode 60-2 connects, in common, the first and the second internal electrodes 45-1 and 45-3 to the second input terminal 47-2. Similarly, the second driving block 42 comprises a first outer electrode 60-1' formed on the first side surface and a second outer electrode (not shown) formed on the second side surface. The first outer electrode 60-1' connects, in common, the second and the fourth internal electrodes 45-2' and 45-4' to the first input terminal 47-1. The second outer electrode connects, in common, the first and the second internal electrodes 45-1' and 45-3' to the second input terminal 47-2.

In the voltage generating block 43, first and second primary strip outer electrodes 63-1 and 63-2 (FIG. 16) are formed on the first and the second side surfaces, respectively, in place of the primary strip electrode 43-4 (FIG. 4). First and second secondary outer electrodes 61 and 62 are formed on the upper surface and the first and the second side surfaces in place of the first and the second secondary outer electrodes 51 and 52. The first secondary outer electrode 61 comprises a strip electrode portion 61-1 formed on the upper surface and the first and the second side surfaces and a plate electrode portion 61-2 formed on the fifth thin piezoelectric layer 44-5. In other words, the strip electrode portion 61-1 surrounds the first through the fourth secondary internal strip electrodes 49-6 to 49-9 on the first and the second side surfaces and the upper surface. The first and the second primary strip outer electrodes 63-1 and 63-2 connect, in common, both sides of the first through the fourth primary internal strip electrodes 43-6 to 43-9 to the first output terminal 48-1. The first secondary outer electrode 61 connects, in common, both sides of the first through the fourth secondary internal strip electrodes 49-6 to 49-9 to the second output terminal 48-2. Similarly, the second secondary outer electrode 62 connects, in common, both sides of the first through the fourth secondary internal strip electrodes 49-6' to 49-9' to the second output terminal 48-2.

It should be noted here that the outer electrodes are not formed on the first thin piezoelectric layer 44-1. This is because the first thin piezoelectric layer 44-1 serves as the inactive piezoelectric layer.

The piezoelectric transformer operates by the same principle as that of the piezoelectric transformer illustrated in FIG. 4. Accordingly, it is possible to make the connection points for the first and the second input terminals 47-1 and 47-2 and the first and the second output terminals 48-1 and 48-2 coincide with the respective nodes of the longitudinal vibration tertiary mode as described in conjunction with FIGS. 5 and 6. Although the piezoelectric transformer has a reduced electric power because it has a reduced number of the active piezoelectric layers, it is possible to directly support the piezoelectric transformer at the positions which coincide with the respective nodes because the outer electrodes are not formed on the under surface of the piezoelectric plate member 40.

When the number of the thin piezoelectric layers is equal to eleven as described in conjunction with the first embodiment, it is possible to obtain the output voltage of 480 V and the output electric power of 2.3 W under the condition of the input voltage of 10 $V_{p-p}$.

Figure 17:
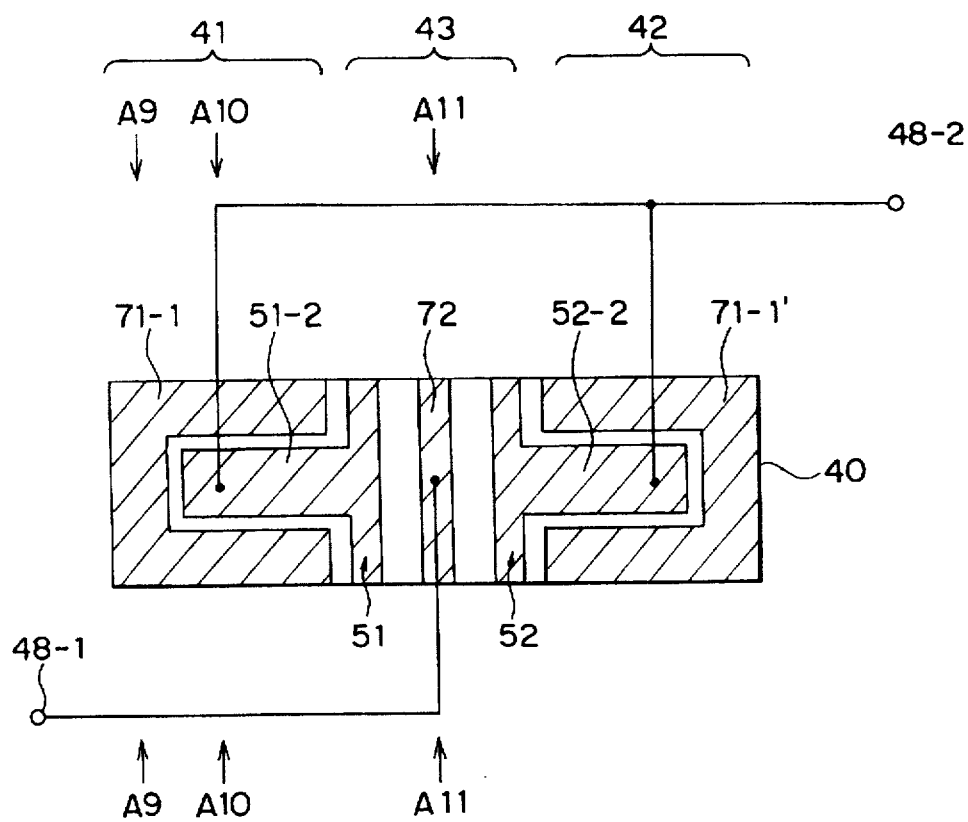
FIG. 17 is a plan view of a piezoelectric transformer according to a third embodiment of this invention.

Referring to FIGS. 17 to 21, the description will proceed to a piezoelectric transformer according to a third embodiment of this invention. In FIG. 17, the piezoelectric transformer is also called a stacked Lozen type and comprises similar parts designated by like reference numerals except that the outer electrodes are different from those illustrated in FIG. 4.

In the first driving block 41, a first outer electrode 71-1 is formed on the upper and the first side surfaces of the piezoelectric plate member 40 while a second outer electrode 71-2 is formed on the under and the second side surfaces. The first outer electrode 71-1 connects, in common, the first and the third internal electrodes 45-1 and 45-3 to the first input terminal 47-1. The second outer electrode 71-2 connects, in common, the second and the fourth internal electrodes 45-2 and 45-4 to the second input terminal 47-2. Similarly, the second driving block 42 comprises a first outer electrode 71-1' formed on the upper and the first side surfaces and a second outer electrode (not shown) formed on the under and the second side surface. The first outer electrode 71-1' connects, in common, the first and the third internal electrodes 45-1' and 45-3' to the first input terminal 47-1. The second outer electrode connects, in common, the second and the fourth internal electrodes 45-2' and 45-4' to the second input terminal 47-2.

Figure 18:
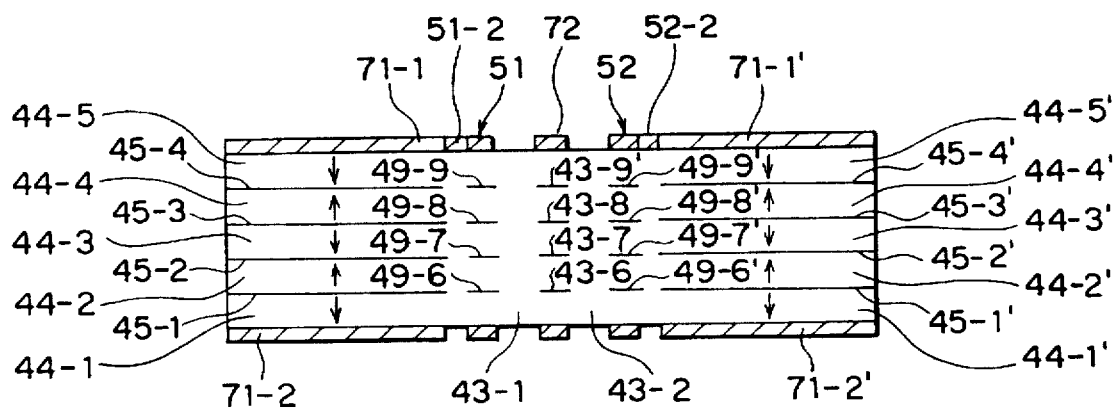
FIG. 18 is a sectional view taken along line A2"—A2" in FIG. 17.
Figure 19:
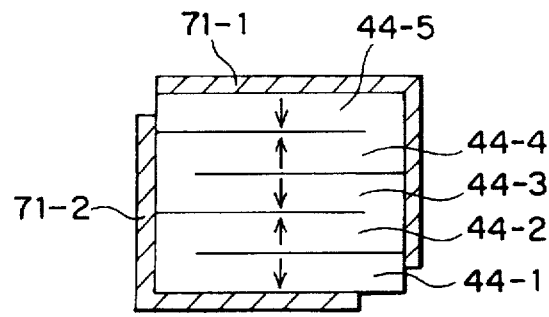
FIG. 19 is a sectional view taken along line A9—A9 in FIG. 17.
Figure 20:
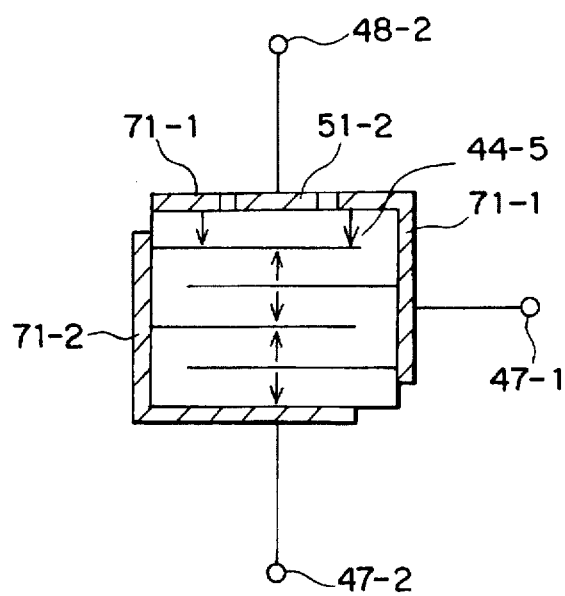
FIG. 20 is a sectional view taken along line A10—A10 in FIG. 17.
Figure 21:
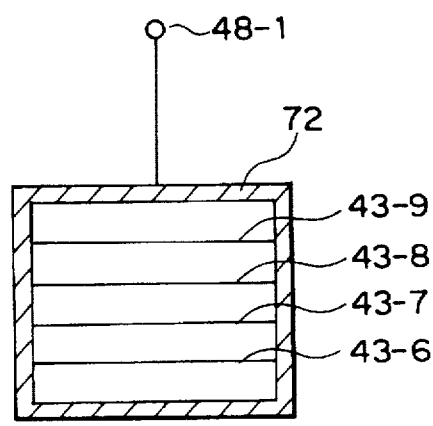
FIG. 21 is a sectional view taken along line A11—A11 in FIG. 17.

It should be noted here that two areas of the fifth thin piezoelectric layer 44-5, namely, under areas of the first outer electrodes 71-1 and 71-1', are polarized in an opposite direction relative to the polarization of the fourth thin piezoelectric layer 44-4 as shown in FIG. 18. This is because the first outer electrodes 71-1 and 71-1' are formed around the plate portions 51-2 and 52-2 so as to cover the upper surface of the fifth thin piezoelectric layer 44-5. As a result, a part of the fifth thin piezoelectric layers 44-5 and 44-5' serves as the active piezoelectric layer.

In the voltage generating block 43, a primary outer strip electrode 72 is formed around the piezoelectric plate member 40 at a middle point thereof so as to surround the first through the fourth primary internal strip electrodes 43-6 to 43-9 on the first and the second side surfaces and the upper and the under surfaces. The first and the second secondary outer electrodes 51 and 52 are formed around the piezoelectric plate member 40 and on the upper surface of the fifth thin piezoelectric layer 44-5 as mentioned in conjunction with FIG. 4. The primary outer strip electrodes 72 connect, in common, both sides of the first through the fourth primary internal strip electrodes 43-6 to 43-9 to the first output terminal 48-1. In addition, the primary outer strip electrode 43-4 (FIG. 4) may be used in place of the primary outer strip electrode 72. The first secondary outer electrode 51 connects, in common, both sides of the first through the fourth secondary internal strip electrodes 49-6 to 49-9 to the second output terminal 48-2. Similarly, the second secondary outer electrode 52 connects, in common, both sides of the first through the fourth secondary internal strip electrodes 49-6' to 49-9' to the second output terminal 48-2.

The piezoelectric transformer operates by the same principle as that of the piezoelectric transformer illustrated in FIG. 4. Accordingly, it is possible to make the connection points for the first and the second input terminals 47-1 and 47-2 and the first and the second output terminals 48-1 and 48-2 coincide with the respective nodes of the longitudinal vibration tertiary mode as described in conjunction with FIGS. 5 and 6. Since the piezoelectric transformer has an increased number of active piezoelectric layers, it is possible to generate an increased amount of electric power.

When number of the thin piezoelectric layers is equal to eleven as described in conjunction with the first embodiment, it is possible to obtain an output voltage of 580 V and an output electric power of 3.4 W under the condition of an input voltage of 10 $V_{p-p}$.

While this invention has thus far been described in conjunction with a few embodiments thereof, it will readily be possible for those skilled in the art to put this invention into practice in various other manners.

What is claimed is:

1. A piezoelectric transformer, driven by a longitudinal tertiary mode defined by a predetermined wave length, said transformer comprising:

a piezoelectric plate member;

first and second driving blocks which are formed at both sides of said piezoelectric plate member and which are operable in a piezoelectric transverse vibration mode to induce a longitudinal vibration in a longitudinal direction by an a.c. voltage; and a voltage generating block formed between said first and said second driving blocks and which is operable in a piezoelectric longitudinal vibration mode in response to said longitudinal vibration induced by said first and second driving blocks, each of said first and said second driving blocks comprising a plurality of thin piezoelectric layers which are stacked through a plurality of internal electrodes and which are alternatively polarized in a thickness direction of said piezoelectric plate member, said voltage generating block comprising first and second voltage generating portions formed apart from each other to generate an output voltage by said piezoelectric longitudinal vibration mode, a primary voltage producing portion formed between said first and said second voltage generating portions and comprising a plurality of thin piezoelectric layers which are stacked through a plurality of primary internal electrodes, and first and second secondary voltage producing portions formed at both sides of said voltage generating block, each of said first and said second secondary voltage producing portions comprising a plurality of thin piezoelectric layers which are stacked through a plurality of secondary internal electrodes, said first and said second voltage generating portions being polarized in opposite directions in said longitudinal direction, said first and said second driving blocks being supplied, in common, with said a.c. voltage through first and second input terminals, said primary and said first and said second secondary voltage producing portions delivering said output voltage through first and second output terminals, said first input terminal, said second input terminal, said first output terminal and said second output terminal being electrically insulated from each other, and each located at a node of said longitudinal vibration;

said piezoelectric plate member further comprising an inactive piezoelectric layer formed on an upper surface thereof and having upper and under surfaces and first and second side surfaces, said plurality of internal electrodes being numbered from one to n, where n represents a positive integer, and divided into odd and even number groups, each of said first and said second driving blocks further comprising a first outer electrode which is formed on said first side and said under surfaces and a second outer electrode which is formed on said second side surface, said first outer electrode being for connecting, in common, said even number group of said plurality of internal electrodes to one of said first and said second input terminals, said second outer electrode being for connecting, in common, said odd number group of said plurality of internal electrodes to another one of said first and said second input terminals, each of said first and said second input terminals being connected at a predetermined position spaced apart from an end surface of said piezoelectric plate member by a quarter of said predetermined wave length;

wherein said voltage generating block further comprises:

a primary outer electrode formed on said first and said second side surfaces and said under surface for connecting, in common, said plurality of primary internal electrodes to one of said first and said second output terminals;

a first secondary outer electrode formed on said upper and said under surfaces and said first and said second side surfaces for connecting, in common, said plurality of first secondary internal electrodes to another one of said first and said second output terminals; and a second secondary outer electrode formed on said upper and said under surfaces and said first and said second side surfaces for connecting, in common, said plurality of second secondary internal electrodes to said other one of the first and the second output terminals;

each of said first and said second secondary outer electrodes comprising a strip electrode portion formed on said upper and said under surfaces and said first and said second side surfaces and a plate electrode portion formed on said upper surface so as to extend from said strip electrode portion towards said end surface along a longitudinal center axis of said piezoelectric plate member, said strip electrode portion and said plate electrode portion of each of said first and said second secondary electrodes together forming a "T" shape on said upper surface of said piezoelectric plate member;

said first output terminal being connected at a center position placed at a center of said under surface, said second output terminal being connected to said plate electrode portion at a preselected position spaced apart from said end surface of the piezoelectric plate member by said quarter of the predetermined wave length.

2. A piezoelectric transformer as claimed in claim 1, wherein each of said first and said second driving blocks further comprises a subsidiary outer electrode formed on said Upper surface so as to surround said plate electrode portion and connected to one of said first and said second outer electrodes, said inactive piezoelectric layer being polarized in a specific area corresponding to said subsidiary outer electrode in an opposite direction of a polarization of an upper layer in said plurality of thin piezoelectric layers.

3. A piezoelectric transformer, driven by a longitudinal tertiary mode defined by a predetermined wave length, said transformer comprising:

a piezoelectric plate member;

first and second driving blocks which are formed at both sides of said piezoelectric plate member and which are operable in a piezoelectric transverse vibration mode to induce a longitudinal vibration in a longitudinal direction by an a.c. voltage; and a voltage generating block formed between said first and said second driving blocks and which is operable in a piezoelectric longitudinal vibration mode in response to said longitudinal vibration induced by said first and second driving blocks, each of said first and said second driving blocks comprising a plurality of thin piezoelectric layers which are stacked through a plurality of internal electrodes and which are alternatively polarized in a thickness direction of said piezoelectric plate member, said voltage generating block comprising first and second voltage generating portions formed apart from each other to generate an output voltage by said piezoelectric longitudinal vibration mode, a primary voltage producing portion formed between said first and said second voltage generating portions and comprising a plurality of thin piezoelectric layers which are stacked through a plurality of primary internal electrodes, and first and second secondary voltage producing portions formed at both sides of said voltage generating block, each of said first and said second secondary voltage producing portions comprising a plurality of thin piezoelectric layers which are stacked through a plurality of secondary internal electrodes, said first and said second voltage generating portions being polarized in opposite directions in said longitudinal direction, said first and said second driving blocks being supplied, in common, with said a.c. voltage through first and second input terminals, said primary and said first and said second secondary voltage producing portions delivering said output voltage through first and second output terminals, said first input terminal, said second input terminal, said first output terminal and said second output terminal being electrically insulated from each other, and each located at a node of said longitudinal vibration;

said piezoelectric plate member further comprising an inactive piezoelectric layer formed on an upper surface thereof and having upper and under surfaces and first and second side surfaces, said plurality of internal electrodes being numbered from one to n, where n represents a positive integer, and divided into odd and even number groups, each of said first and said second driving blocks further comprising a first outer electrode which is formed on said first side surface and a second outer electrode which is formed on said second side and said under surfaces, said first outer electrode being for connecting, in common, said odd number group of said plurality of internal electrodes to one of said first and said second input terminals, said second outer electrode being for connecting, in common, said even number group of said plurality of internal electrodes to another one of said first and said second input terminals, each of said first and said second input terminals being connected at a predetermined position spaced apart from an end surface of said piezoelectric plate member by a quarter of said predetermined wave length;

wherein said voltage generating block further comprises a primary outer electrode formed on said first and said second side surfaces and said upper surface for connecting, in common, said plurality of primary internal electrodes to said first output terminal, a first secondary outer electrode formed on said upper and said under surfaces and said first and said second side surfaces for connecting, in common, said plurality of first secondary internal electrodes to said second output terminal, and a second secondary outer electrode formed on said upper and said under surfaces and said first and said second side surfaces for connecting, in common, said plurality of second secondary internal electrodes to said second output terminal, each of said first and said second secondary outer electrodes comprising a strip electrode portion formed on said upper and said under surfaces and said first and said second side surfaces and a plate electrode portion formed on said under surface so as to extend from said strip electrode towards said end surface along a longitudinal center axis of said piezoelectric plate member, said strip electrode portion and said plate electrode portion of each of said first and said second secondary electrodes together forming a "T" shape on said upper surface of said piezoelectric plate member, said first output terminal being connected at a center position placed at a center of said upper surface, said second output terminal being connected to said plate electrode portion at a preselected position spaced apart from said end surface of the piezoelectric plate member by said quarter of said predetermined wave length.

4. A piezoelectric transformer as claimed in claim 3, wherein each of said first and said second driving blocks further comprises a subsidiary outer electrode formed on said under surface so as to surround said plate electrode portion and connected to one of said first and said second outer electrodes, said inactive piezoelectric layer being polarized in a specific area corresponding to said subsidiary outer electrode in an opposite direction of a polarization of an under layer in said plurality of thin piezoelectric layers.

5. A piezoelectric transformer, driven by a longitudinal tertiary mode defined by a predetermined wave length, said transformer comprising:

a piezoelectric plate member;

first and second driving blocks which are formed at both sides of said piezoelectric plate member and which are operable in a piezoelectric transverse vibration mode to induce a longitudinal vibration in a longitudinal direction by an a.c. voltage; and a voltage generating block formed between said first and said second driving blocks and which is operable in a piezoelectric longitudinal vibration mode in response to said longitudinal vibration induced by said first and second driving blocks, each of said first and said second driving blocks comprising a plurality of thin piezoelectric layers which are stacked through a plurality of internal electrodes and which are alternatively polarized in a thickness direction of said piezoelectric plate member, said voltage generating block comprising first and second voltage generating portions formed apart from each other to generate an output voltage by said piezoelectric longitudinal vibration mode, a primary voltage producing portion formed between said first and said second voltage generating portions and comprising a plurality of thin piezoelectric layers which are stacked through a plurality of primary internal electrodes, and first and second secondary voltage producing portions formed at both sides of said voltage generating block, each of said first and said second secondary voltage producing portions comprising a plurality of thin piezoelectric layers which are stacked through a plurality of secondary internal electrodes, said first and said second voltage generating portions being polarized in opposite directions in said longitudinal direction, said first and said second driving blocks being supplied, in common, with said a.c. voltage through first and second input terminals, said primary and said first and said second secondary voltage producing portions delivering said output voltage through first and second output terminals, said first input terminal, said second input terminal, said first output terminal and said second output terminal being electrically insulated from each other, and each located at a node of said longitudinal vibration;

said piezoelectric plate member further comprising inactive piezoelectric layers formed on upper and under surfaces, respectively, thereof and having upper and under surfaces and first and second side surfaces, said plurality of internal electrodes being numbered from one to n, where n represents a positive integer, and divided into odd and even number groups, each of said first and said second driving blocks further comprising first and second outer electrodes which are formed on said first and said second side surfaces, respectively, said first outer electrode being for connecting, in common, said odd number group of said plurality of internal electrodes to one of said first and said second input terminals, said second outer electrode being for connecting, in common, said even number group of said plurality of internal electrodes to another one of said first and said second input terminals, each of said first and said second input terminals being connected at a predetermined position spaced apart from an end surface of said piezoelectric plate member by a quarter of said predetermined wave length;

wherein said voltage generating block further comprises first and second primary outer electrodes formed on said first and said second side surfaces, respectively, for connecting, in common, said plurality of primary internal electrodes to said first output terminal, a first secondary outer electrode formed on said upper surface and said first and said second side surfaces for connecting, in common, said plurality of secondary internal electrodes to said second output terminal, and a second secondary outer electrode formed on said upper surface and said first and said second side surfaces for connecting, in common, said plurality of secondary internal electrodes to said second output terminal, each of said first and said second secondary outer electrodes comprising a strip electrode portion formed on said upper surface and said first and said second side surfaces and a plate electrode portion formed on said upper surface so as to extend from said strip electrode portion towards said end surface along a longitudinal center axis of said piezoelectric plate member, said strip electrode portion and said plate electrode portion of each of said first and said second secondary electrodes together forming a "T" shape on said upper surface of said piezoelectric plate member, said first output terminal being connected at a center position of said piezoelectric plate member, said second output terminal being connected at a preselected position spaced apart from said end surface by a quarter of said predetermined wave length.

* * * * *